(12) United States Patent
Gabric et al.

(10) Patent No.: US 7,016,251 B2
(45) Date of Patent: Mar. 21, 2006

(54) METHOD AND APPARATUS FOR INITIALIZING SRAM DEVICE DURING POWER-UP

(75) Inventors: John A. Gabric, Essex Junction, VT (US); Harold Pilo, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 38 days.

(21) Appl. No.: 10/710,707

(22) Filed: Jul. 29, 2004

(65) Prior Publication Data

US 2006/0023521 A1    Feb. 2, 2006

(51) Int. Cl.
*G11C 7/00*    (2006.01)

(52) U.S. Cl. ............. 365/226; 365/189.11; 365/230.06

(58) Field of Classification Search ................ 365/226, 365/189.11, 230.06, 203
See application file for complete search history.

(56) References Cited

U.S. PATENT DOCUMENTS

| | | |
|---|---|---|
| 5,018,102 A | 5/1991 | Houston |
| 5,136,186 A | 8/1992 | Trinh et al. |
| 5,212,663 A | 5/1993 | Leong |
| 5,257,239 A | 10/1993 | Guo et al. |
| 5,473,562 A | 12/1995 | Liu |
| 5,526,318 A * | 6/1996 | Slemmer et al. ............ 365/226 |
| 5,726,944 A * | 3/1998 | Pelley et al. ................. 365/226 |
| 5,737,612 A | 4/1998 | Ansel et al. |
| 5,809,312 A | 9/1998 | Ansel et al. |
| 5,864,457 A | 1/1999 | Kates et al. |
| 6,081,466 A | 6/2000 | McClure et al. |
| 6,731,546 B1 | 5/2004 | Marr |

\* cited by examiner

*Primary Examiner*—Son T. Dinh
(74) *Attorney, Agent, or Firm*—Robert A. Walsh; Cantor Colburn LLP

(57) ABSTRACT

A method for initializing a static random access memory (SRAM) device during power-up includes clamping one of a pair of bitlines of the SRAM device to a logic low potential while allowing the other of the pair of bitlines to be coupled to a charging logic high potential. An SRAM storage cell within the SRAM device is forced to a stable state by selectively allowing a wordline potential of a wordline associated with the SRAM storage cell to follow the charging logic high potential, thereby coupling the SRAM storage cell to the pair of bitlines.

20 Claims, 4 Drawing Sheets

US 7,016,251 B2

METHOD AND APPARATUS FOR INITIALIZING SRAM DEVICE DURING POWER-UP

BACKGROUND OF INVENTION

The present invention relates generally to integrated circuit memory devices and, more particularly, to a method and apparatus for initializing an SRAM device during power-up.

A typical static random access memory (SRAM) device includes an array of individual SRAM cells. Each SRAM cell is capable of storing a binary voltage value therein, which voltage value represents a logical data bit (e.g., "0" or "1"). One existing configuration for an SRAM cell includes a pair of cross-coupled devices such as inverters. With CMOS (complementary metal oxide semiconductor) technology, the inverters further include a pull-up PFET (p-channel) transistor connected to a complementary pull-down NFET (n-channel) transistor. The inverters, connected in a cross-coupled configuration, act as a latch that stores the data bit therein so long as power is supplied to the memory array. In a conventional six-transistor cell, a pair of access transistors or pass gates (when activated by a wordline) selectively couples the inverters to a pair of complementary bitlines.

An SRAM array, being a volatile memory device, does not retain the cell data therein once the array is disconnected from its power supply. Thus, during power-up of the array, the individual cells therein may experience a metastable state in which the two cell nodes initially remain at approximately equal voltages somewhere between the nominal supply voltage value and ground. Under these conditions, the memory cell will experience high current conduction and unwanted power consumption as both the NFET and PFET devices of each inverter simultaneously conduct. In addition to this DC power consumption, a typical SRAM array utilizes a bitline precharging scheme in which the bitlines are precharged to $V_{DD}$ potential during power-up. This provides a further AC current component in addition to the DC current dissipated by the metastable cells.

Excessive power-up currents create power supply problems in both system and test environments. Tester supply ramp rates are carefully adjusted to account for these excessive currents. Furthermore, system power supplies may have to be over-designed to account for the above described initial high-current surge at power-up and prevent power supply stall. Metastability and high currents at power-up can be quite unpredictable and thus cannot be easily managed. Currents in the 10 A range have been observed in an 18 Mb CAM (content addressable memory) array during power-up. As SRAM densities increase with technology scaling, power-up currents resulting from metastable arrays may eventually exceed the capabilities of the tester/system power supplies.

Accordingly, it would be desirable to be able to alleviate the high-current condition created by powering up a metastable memory device such as an SRAM or CAM array.

SUMMARY OF INVENTION

The foregoing discussed drawbacks and deficiencies of the prior art are overcome or alleviated by a method for initializing a static random access memory (SRAM) device during power-up. In an exemplary embodiment, the method includes clamping one of a pair of bitlines of the SRAM device to a logic low potential while allowing the other of the pair of bitlines to be coupled to a charging logic high potential. An SRAM storage cell within the SRAM device is forced to a stable state by selectively allowing a wordline potential of a wordline associated with the SRAM storage cell to follow the charging logic high potential, thereby coupling the SRAM storage cell to the pair of bitlines.

In another embodiment, an apparatus for initializing a static random access memory (SRAM) device during power-up includes a clamping device configured to hold one of a pair of bitlines of the SRAM device at a logic low potential while the other of the pair of bitlines is coupled to a charging logic high potential. An isolation device is configured to force an SRAM storage cell within the SRAM device to a stable state by selectively allowing a wordline potential of a wordline associated with the SRAM storage cell to follow the charging logic high potential, thereby coupling the SRAM storage cell to the pair of bitlines.

BRIEF DESCRIPTION OF DRAWINGS

Referring to the exemplary drawings wherein like elements are numbered alike in the several Figures.

DETAILED DESCRIPTION

Disclosed herein is a method and apparatus for initializing an SRAM device during power-up that advantageously utilizes the leakage array mechanisms of the FET devices within the wordline (WL) driver circuitry and/or p-well control of the array NFETs to initialize the cells at power-up with the minimum amount of circuitry and area overhead. Moreover, (and in contrast to existing power-up schemes) one of the bitlines in the bitline pair is kept at $V_{SS}$ (also used interchangeably with the terms "ground" and "logic low potential" herein) during power-up to further reduce the chip current demand during this period. The circuit techniques described hereinafter may be easily integrated with little impact to existing circuit topologies, area overhead and layout complexity.

Figure 1:
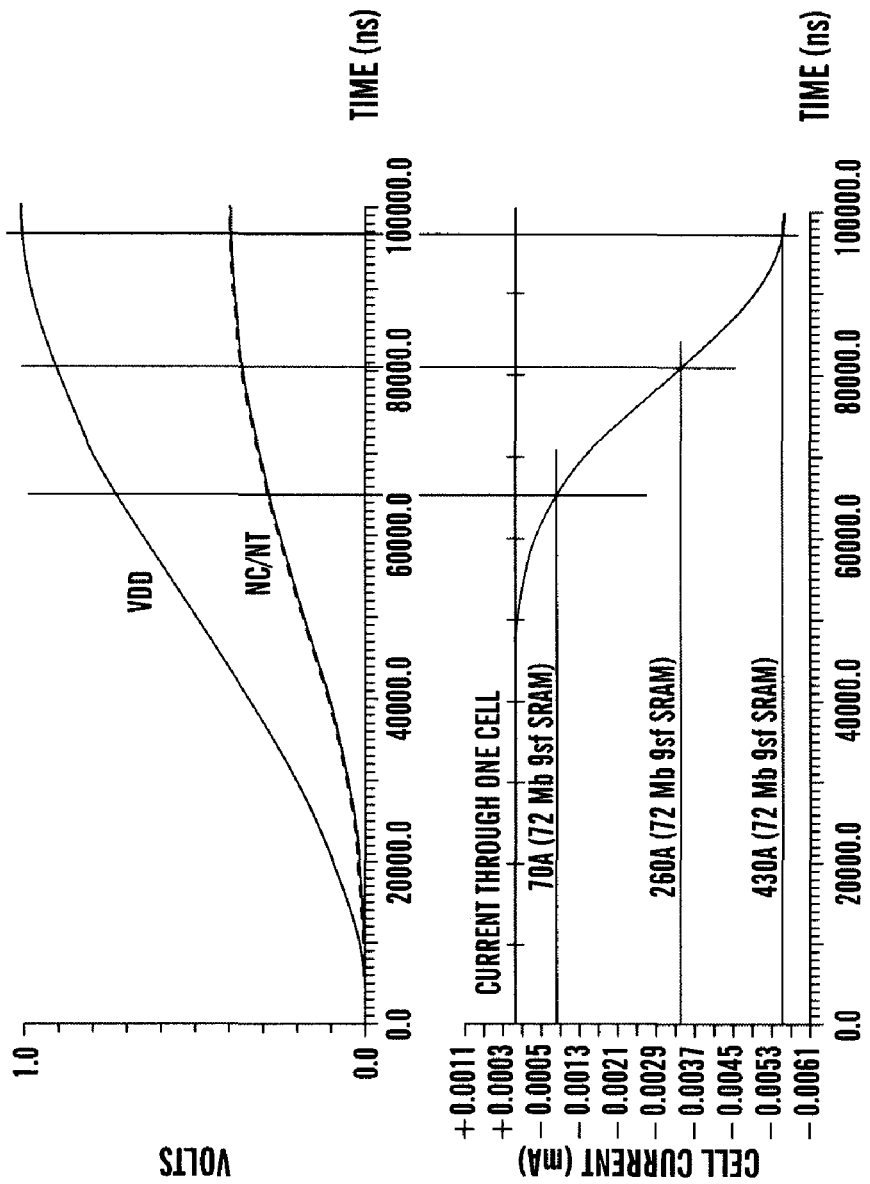
FIG. 1 is a graph illustrating a simulated current consumption during a conventional power-up process for a 72 Mb SRAM array.

Referring initially to FIG. 1, there is shown a graph 100 illustrating a simulated cell current consumption during a conventional power-up process for a 72 Mb SRAM array. The top portion of graph 100 shows the supply voltage $V_{DD}$ ramping up from 0 V to 1.0 V over a period of about 100 µs, with the internal SRAM cell nodes NC/NT powering-up to an approximately equal, metastable level between 0 V and $V_{DD}$. As indicated previously, a metastable SRAM cell begins to draw an undesirable DC current component through the internal FET devices over time. Thus, the bottom portion of graph 100 illustrates the resulting cell current drawn by an individual, metastable SRAM cell during the same power-up interval.

At about 65 µs into power-up, the graph 100 demonstrates that a single metastable cell will draw about 0.9 µA of current. This metastable current level increases to about 3.5 µA after 80 µs, and to about 5.5 µA after 100 µs. Given an SRAM array of over 72 million individual cells, there is a theoretical possibility that if every cell in the array remains in a metastable state for a duration of 100 μs into power-up, then the total current draw could reach a level on the order of about 430 A. Although such a scenario is highly unlikely as a practical matter, it will at least be appreciated that even if a small percentage of array cells (e.g., 5–10%) remain metastable for the duration of power-up, then the device could draw a significant amount of DC current without state resolution.

Figure 2:
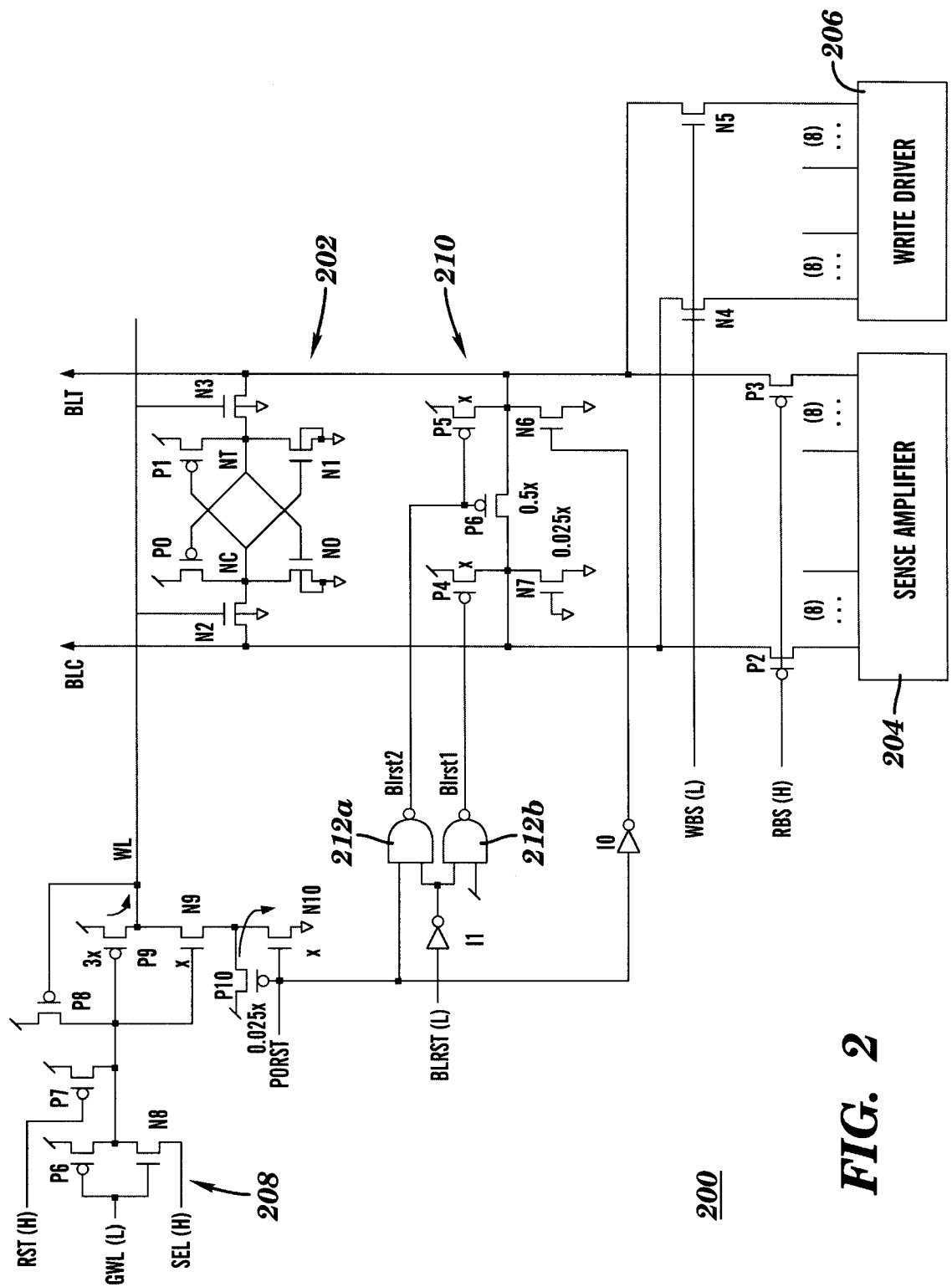
FIG. 2 is a schematic diagram illustrating a method and apparatus for initializing an SRAM device during power-up, in accordance with an embodiment of the invention.

Therefore, in accordance with an embodiment of the invention, FIG. 2 is a schematic circuit diagram illustrating a method and apparatus 200 for initializing an SRAM device during power-up. As will be recognized from the circuit diagram shown in FIG. 2, an individual SRAM cell 202 includes cross-coupled CMOS inverter pairs P0/N0 and P1/N1, along with NFET access transistors N2, N3 that selectively couple the internal cell nodes NC, NT, to a corresponding bitline pair BLC, BLT, upon an appropriate control signal applied by a locally selected wordline WL. For illustrative purposes, FIG. 2 also includes a representation of the sense amplifier circuitry 204 used for read operations, as well as write driver circuitry 206 used for write operations. The sense amplifier circuitry 204 is coupled to the bitline pair BLC, BLT, through PFET bit-switch transistors P2 and P3 (controlled by signal RBS), while the write driver circuitry 206 is coupled to the bitline pair BLC, BLT, through NFET bit-switch transistors N4 and N5 (controlled by signal WBS).

Also illustrated in FIG. 2 is the local wordline driver/restore circuitry 208 (including P6, P7, P8, P9, N8 and N9) controlled by a global wordline signal GWL, a local wordline decode signal SEL, and a wordline restore control signal RST. As will be recognized, the wordline driver/restore circuitry 208 is driven by self-resetting logic and is configured to power-up to the shown reset state.

It should be noted at this point that the schematic diagram of FIG. 2 illustrates exemplary relative strength values of the various NFET and PFET devices. For example, a device labeled "0.5x" has about half the strength (and thus size) of a device labeled "x". However, such designations are provided by way of example only and should not be construed in any limiting sense.

As indicated previously, a first aspect of the embodiment of FIG. 2 operates to reduce the amount of current drawn by the array during power-up by limiting the AC current component created by precharging of the bitlines BLC, BLT to $V_{DD}$. In this regard, the conventional bitline precharge/restore circuitry 210 (e.g., PFETs P4, P5, and P6) is modified by the addition of a pull-down NFET N6 that is configured to clamp one of the bitlines (BLT in this example) to ground during power-up. Another NFET N7 is used in conjunction with P4 for parasitic matching purposes, but has its gate terminal tied to ground so as to allow the other bitline (BLC) to be precharged to $V_{DD}$.

The second main aspect of the embodiment of FIG. 2 involves preconditioning the cell 202 to a stable state during power-up by utilizing the subthreshold and tunnel leakage current effects of PFET P9 within the wordline driver circuitry 208 so as to allow the voltage on the wordline WL to track the $V_{DD}$ voltage during power-up. The rise in the wordline voltage in turn causes the internal cell nodes NC, NT, to be coupled to the bitline pair BLC, BLT, thereby allowing the voltage differential therebetween to force the cell to a stable state. In this regard, an additional NFET N10 is placed in series with N9 in order to selectively isolate N9 from ground. This prevents N9 from providing a path for the leakage current through P9 and keeping WL at ground. In so doing, the leakage current through P9 will instead charge the wordline WL so that the voltage thereon tracks the power-up voltage on $V_{DD}$. Because N10 may also have leakage effects associated therewith, another weak PFET P10 is provided in the embodiment of FIG. 2 as a separate leakage current supply such that N10 will not draw leakage current away from WL.

The coordination of these current-saving aspects will be understood with reference to the power-on reset signal PORST, which may be generated on-chip or, alternatively, may be software-controlled. In the embodiment shown, PORST is low during power-up and trips up to $V_{DD}$ once a power-up detection level is met. Accordingly, during a power-up sequence, a low voltage on PORST is inverted to high by inverter 10, thus rendering N6 conductive so as to clamp BLT to ground. In addition, so long as PORST is low, the output signal of NAND gate 212a (Blrst2) will be high so as to prevent P6 from conducting and shorting the bitlines to one another. This high signal also prevents P5 from opposing N6 in pulling BLT to ground. At the same time, the low voltage on PORST prevents N9 from being coupled to ground, while also activating leakage current source P10. Thus, the leakage current through P9 that would ordinarily keep WL at ground potential is instead used to charge WL. In order to prevent a leakage path through N10 from opposing the charging of WL, leakage current source P10 is provided.

Referring once again to the precharge circuitry 210, an active-low bitline restore signal (BLRST) is coupled, through inverter I1, to both NAND gate 212a and 212b. The other input to NAND gate 212b is coupled to logic high. As such, signal Blrst1 is a reproduction of BLRST, with the second NAND gate 212b being utilized for performance matching purposes. So long as BLRST is low, BLC will be precharged to $V_{DD}$ through P4.

Once the potential on $V_{DD}$ reaches a predetermined value, PORST will switch from low to high. At this point, N6 will be deactivated so as to allow BLT to be precharged to $V_{DD}$ through activation of P5 and P6, assuming BLRST is still active low. Furthermore, N10 is now rendered conductive so as to allow WL to return to its unselected state and thus isolate the SRAM cell nodes from the bitline pair. As a result of the forced state in the SRAM cell (caused by the tracking WL voltage) and the clamping of BLT to ground, the power-up process implemented using the embodiment of FIG. 2 consumes significantly less current than compared to conventional configurations having metastable cells and both bitlines precharged.

Figure 3:
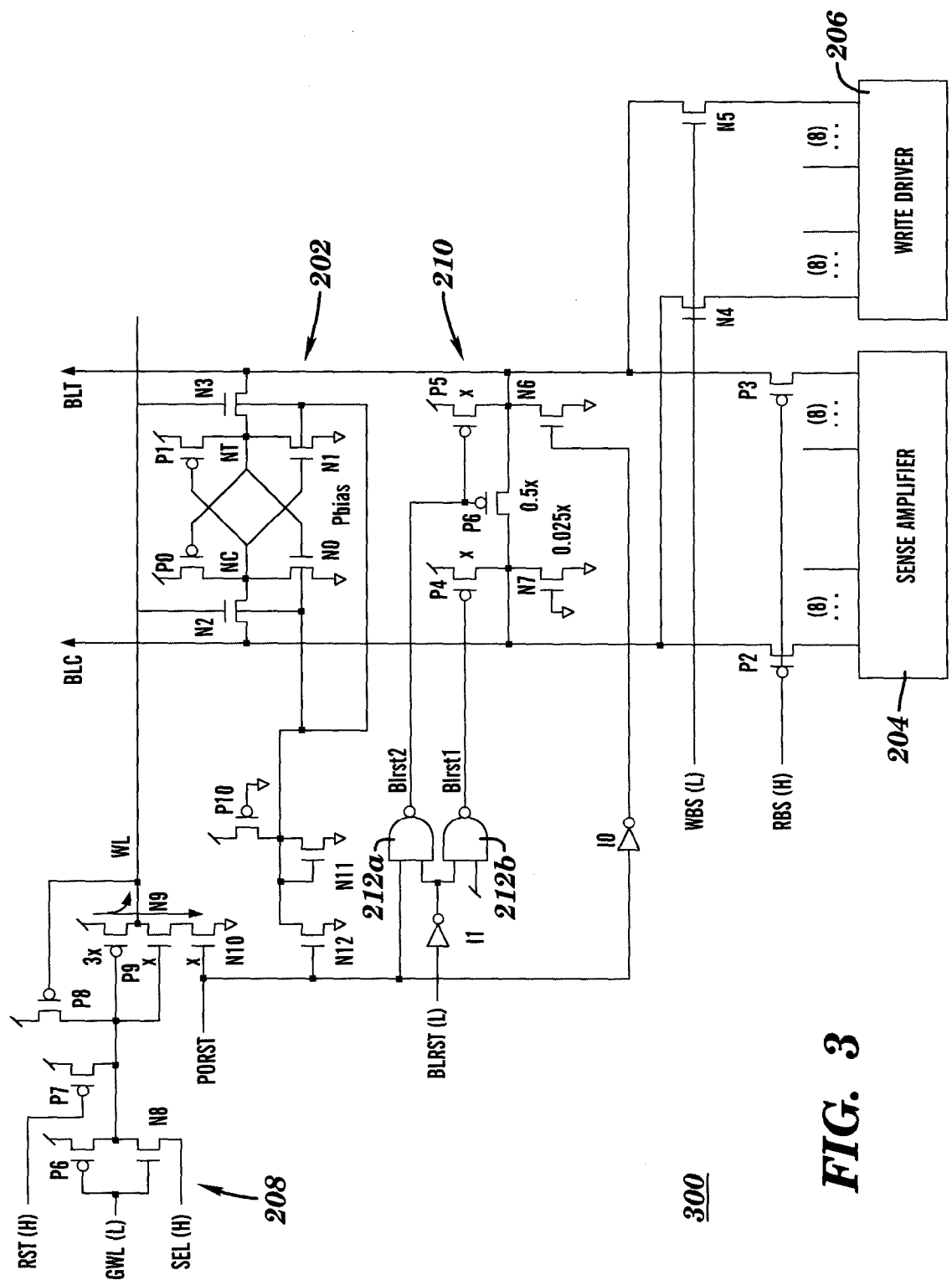
FIG. 3 is a schematic diagram of an alternative embodiment of the method and apparatus of FIG. 2.

Referring now to FIG. 3, there is shown schematic diagram of an alternative embodiment 300 of the method and apparatus of FIG. 2. In this embodiment, a leakage current supply PFET is not used in conjunction with NFET N10. As a result, N10 will draw some of the leakage current through P9 thereby decreasing the ability of the wordline voltage to track the ramping $V_{DD}$ voltage. However, in order to compensate for a lower voltage on WL, a p-well bias is applied to each of the NFET devices of the SRAM cell 202 (i.e., N0, N1, N2 and N3), thus reducing the threshold voltage of those devices (e.g., by approximately 50 mV) and allowing the cell 202 to be preconditioned (written) at a lower value of WL voltage. As specifically shown in FIG. 3, the p-well bias is generated through pull-up PFET P10 and NFET N11, which is configured as a diode. Accordingly, the body terminals (p-wells) of the cell NFETs are coupled to a potential equal to the threshold voltage ($V_{TH}$) of N11, instead of ground, during power-up. Once the proper $V_{DD}$ potential is reached, PORST goes high and the body terminals of the cell NFETs are coupled to ground through N12.

Figure 4:
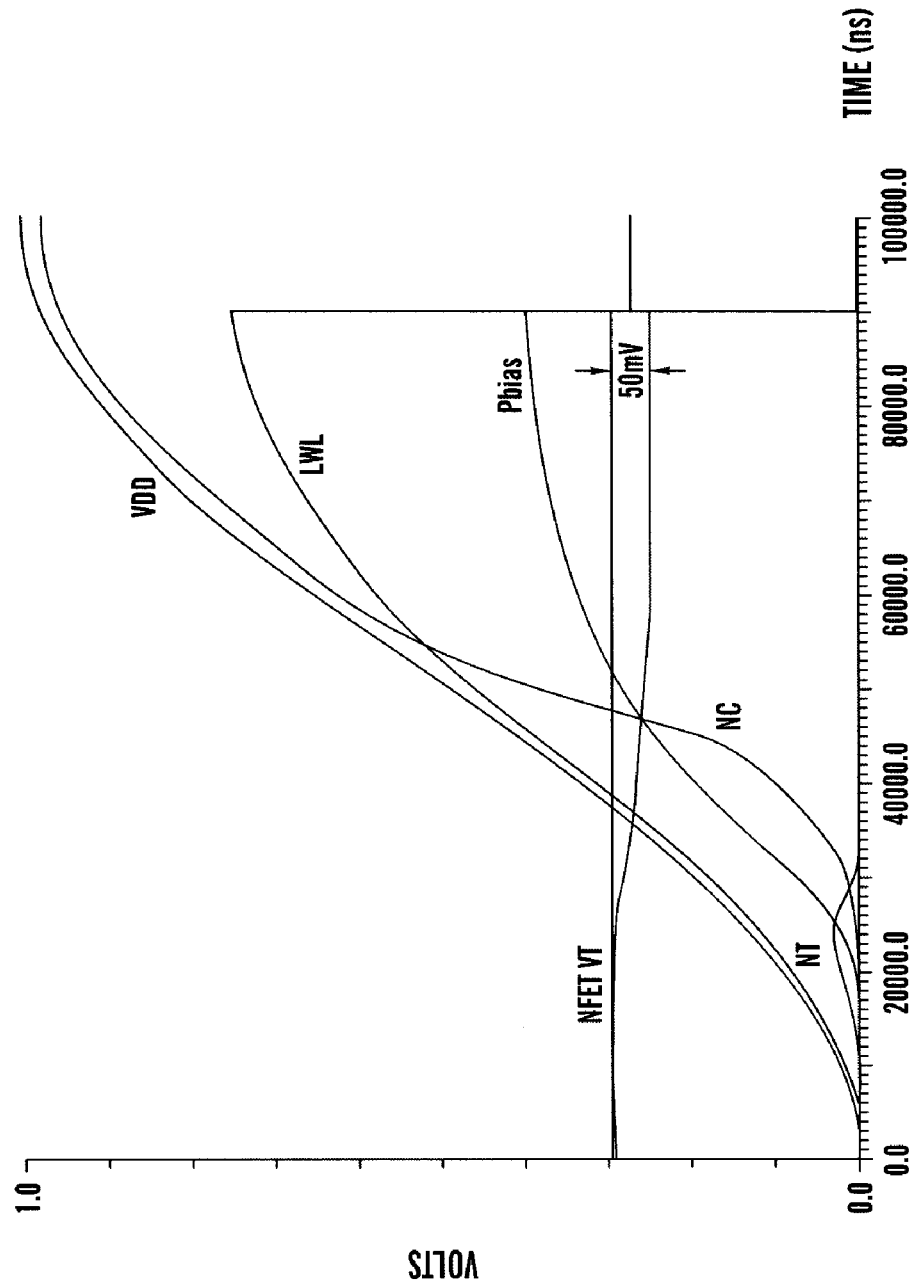
FIG. 4 is a graph illustrating various SRAM node voltages during power-up, using the initialization process of the present invention embodiments.

Finally, FIG. 4 is a graph 400 illustrating various SRAM node voltages during power-up, using the initialization process of the present invention embodiments. In order to demonstrate the robustness of the method, a 1 $\mu$A current source was coupled between cell node NC and $V_{SS}$. As is shown, the wordline voltage (LWL) tracks well with respect to the rising $V_{DD}$ voltage during power-up. Moreover, although node NC is initially biased toward ground (and NT toward $V_{DD}$) due to the current source, the voltages are pulled in the opposite direction, and the cell is forced to a stable state about halfway into the power-up sequence. At about 90 $\mu$s, the wordline voltage is abruptly re-coupled to ground as a result of the power-on reset signal PORST switching to logic high.

Also illustrated in graph 400 is the p-well bias voltage created by the embodiment of FIG. 3. As is shown, there is a voltage threshold reduction of about 50 mV of the cell NFET devices when a p-well bias voltage is applied. Once PORST switches to high, the p-well bias voltage is removed and the p-wells of the NFET devices are returned to ground potential.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method for initializing a static random access memory (SRAM) device during power-up, the method comprising:
    clamping one of a pair of bitlines of the SRAM device to a logic low potential while allowing the other of the pair of bitlines to be coupled to a charging logic high potential; and
    forcing an SRAM storage cell within the SRAM device to a stable state by selectively allowing a wordline potential of a wordline associated with said SRAM storage cell to follow said charging logic high potential, thereby coupling said SRAM storage cell to said pair of bitlines.

2. The method of claim 1, wherein said allowing said wordline potential to follow said charging logic high potential is implemented by selectively coupling a leakage current to said wordline, said leakage current originating from wordline driver circuitry associated with said wordline.

3. The method of claim 2, wherein said clamping one of a pair of bitlines of the SRAM device to a logic low potential is implemented through activation of an NFET device included within bitline precharging circuitry associated with said bitline pair.

4. The method of claim 3, wherein said clamping one of a pair of bitlines of the SRAM device to a logic low potential and said coupling a leakage current to said wordline are gated by a power-on reset signal.

5. The method of claim 3, wherein said power-on reset signal is generated on-chip.

6. The method of claim 3, wherein said power-on reset signal is software controlled.

7. The method of claim 2, wherein said leakage current is selectively coupled to said wordline through a NFET device configured to selectively isolate said wordline from ground potential.

8. The method of claim 7, further comprising providing a separate leakage current source for said NFET device so as to prevent said NFET device from bleeding said leakage current originating from wordline driver circuitry away from said wordline.

9. The method of claim 8, wherein said separate leakage current source comprises a PFET device.

10. The method of claim 7, further comprising coupling NFET devices within said SRAM cell to a p-well bias voltage above said logic low potential so as to reduce a threshold voltage thereof.

11. An apparatus for initializing a static random access memory (SRAM) device during power-up, comprising:
    a clamping device configured to hold one of a pair of bitlines of the SRAM device to a logic low potential while the other of the pair of bitlines is coupled to a charging logic high potential; and
    an isolation device configured to force an SRAM storage cell within the SRAM device to a stable state by selectively allowing a wordline potential of a wordline associated with said SRAM storage cell to follow said charging logic high potential, thereby coupling said SRAM storage cell to said pair of bitlines.

12. The apparatus of claim 11, wherein said isolation device is further configured to selectively couple a leakage current to said wordline, said leakage current originating from wordline driver circuitry associated with said wordline.

13. The apparatus of claim 12, wherein said clamping device further comprises an NFET included within bitline precharging circuitry associated with said bitline pair.

14. The apparatus of claim 13, wherein said clamping device and said isolation device are gated by a power-on reset signal.

15. The apparatus of claim 13, wherein said power-on reset signal is generated on-chip.

16. The apparatus of claim 13, wherein said power-on reset signal is software controlled.

17. The apparatus of claim 12, wherein said isolation device further comprises an NFET configured to selectively isolate said wordline from ground potential.

18. The apparatus of claim 17, further comprising a separate leakage current source for said isolation device so as to prevent said isolation device from bleeding said leakage current originating from wordline driver circuitry away from said wordline.

19. The apparatus of claim 18, wherein said separate leakage current source comprises a PFET.

20. The apparatus of claim 17, further comprising p-well bias voltage source for selectively coupling NFET devices within said SRAM cell to a p-well bias voltage above said logic low potential so as to reduce a threshold voltage thereof.

* * * * *